United States Patent
Kim et al.

(10) Patent No.: US 9,845,535 B2
(45) Date of Patent: Dec. 19, 2017

(54) METHOD OF MANUFACTURING MULTI-LAYER THIN FILM, MEMBER INCLUDING THE SAME AND ELECTRONIC PRODUCT INCLUDING THE SAME

(71) Applicant: SAMSUNG ELECTRONICS CO., LTD., Suwon-si (KR)

(72) Inventors: Jin Sub Kim, Yongin-si (KR); Hyong Jun Yoo, Hwaseong-si (KR); Min Chul Jung, Pyeongtaek-si (KR); Hyun Jun Jung, Yongin-si (KR); Jin Hyun Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 525 days.

(21) Appl. No.: 14/291,652

(22) Filed: May 30, 2014

(65) Prior Publication Data

US 2014/0355184 A1 Dec. 4, 2014

(30) Foreign Application Priority Data

| | | |
|---|---|---|
| May 31, 2013 | (KR) | 10-2013-0062484 |
| Jul. 4, 2013 | (KR) | 10-2013-0078132 |
| Oct. 31, 2013 | (KR) | 10-2013-0131649 |

(51) Int. Cl.

| | |
|---|---|
| *B05D 1/04* | (2006.01) |
| *B05D 1/38* | (2006.01) |
| *B32B 15/082* | (2006.01) |
| *C23C 28/00* | (2006.01) |
| *C23C 14/00* | (2006.01) |
| *C23C 14/34* | (2006.01) |
| *C23C 30/00* | (2006.01) |

(52) U.S. Cl.
CPC .......... *C23C 28/34* (2013.01); *C23C 14/0015* (2013.01); *C23C 14/3485* (2013.01); *C23C 28/00* (2013.01); *C23C 28/322* (2013.01); *C23C 30/005* (2013.01); *Y10T 428/264* (2015.01); *Y10T 428/31522* (2015.04); *Y10T 428/31544* (2015.04); *Y10T 428/31678* (2015.04); *Y10T 428/31681* (2015.04); *Y10T 428/31699* (2015.04)

(58) Field of Classification Search
USPC .............................. 427/409, 419.7; 428/416
See application file for complete search history.

(56) References Cited

U.S. PATENT DOCUMENTS

| | | | |
|---|---|---|---|
| 6,399,219 | B1 | 6/2002 | Welty et al. |
| 9,229,478 | B2 * | 1/2016 | Zhang ................... G06F 1/1626 |
| 2005/0249886 | A1 | 11/2005 | Ge |
| 2006/0019089 | A1 | 1/2006 | Leininger |
| 2008/0035460 | A1 | 2/2008 | Hwang et al. |
| 2010/0055419 | A1 * | 3/2010 | Wu ......................... B44C 1/228 |
| | | | 428/206 |
| 2010/0272932 | A1 | 10/2010 | Izumo et al. |
| 2011/0217565 | A1 | 9/2011 | Tada et al. |
| 2012/0161591 | A1 | 6/2012 | Wang et al. |

FOREIGN PATENT DOCUMENTS

| | | | |
|---|---|---|---|
| TW | 201212782 | * | 3/2012 |
| WO | 2014193097 A1 | | 12/2014 |

OTHER PUBLICATIONS

Communication dated Aug. 25, 2014, issued by the International Searching Authority in counterpart International Application No. PCT/KR2014/004251.
Communication dated Nov. 2, 2016, issued by the European Patent Office in counterpart European Application No. 14804026.4.
Kuruppu et al: "Monolithic and multilayer Cr/CrN, Cr/Cr2N, and Cr2N/CrN coatings on hard and soft substrates" J. Vac. Sci. Technol. A , vol. 16 , No. 3,, May/Jun. 1998, pp. 1949-1955 (7 pages total).
Communication dated Apr. 28, 2017, issued by the State Intellectual Property Office of the People's Republic of China in counterpart Chinese Patent Application No. 201480027819.5.
Communication dated May 12, 2017, issued by the European Patent Office in counterpart European Patent Application No. 14804026.4.

\* cited by examiner

*Primary Examiner* — Tae H Yoon
(74) *Attorney, Agent, or Firm* — Sughrue Mion, PLLC

(57) ABSTRACT

Disclosed herein is a method of forming a multilayer thin film by depositing target particles, detached from a target by plasma discharge of inert gas, on a metal object using a multilayer thin film deposition apparatus and a multilayer thin film formed by the method. More specifically, a sputtering deposition apparatus is used as the multilayer thin film deposition apparatus. The method includes coating a metal object with a coating layer, depositing at least one hardness-enhancing layer on the coating layer, and depositing a color layer on the at least one hardness-enhancing layer.

20 Claims, 12 Drawing Sheets

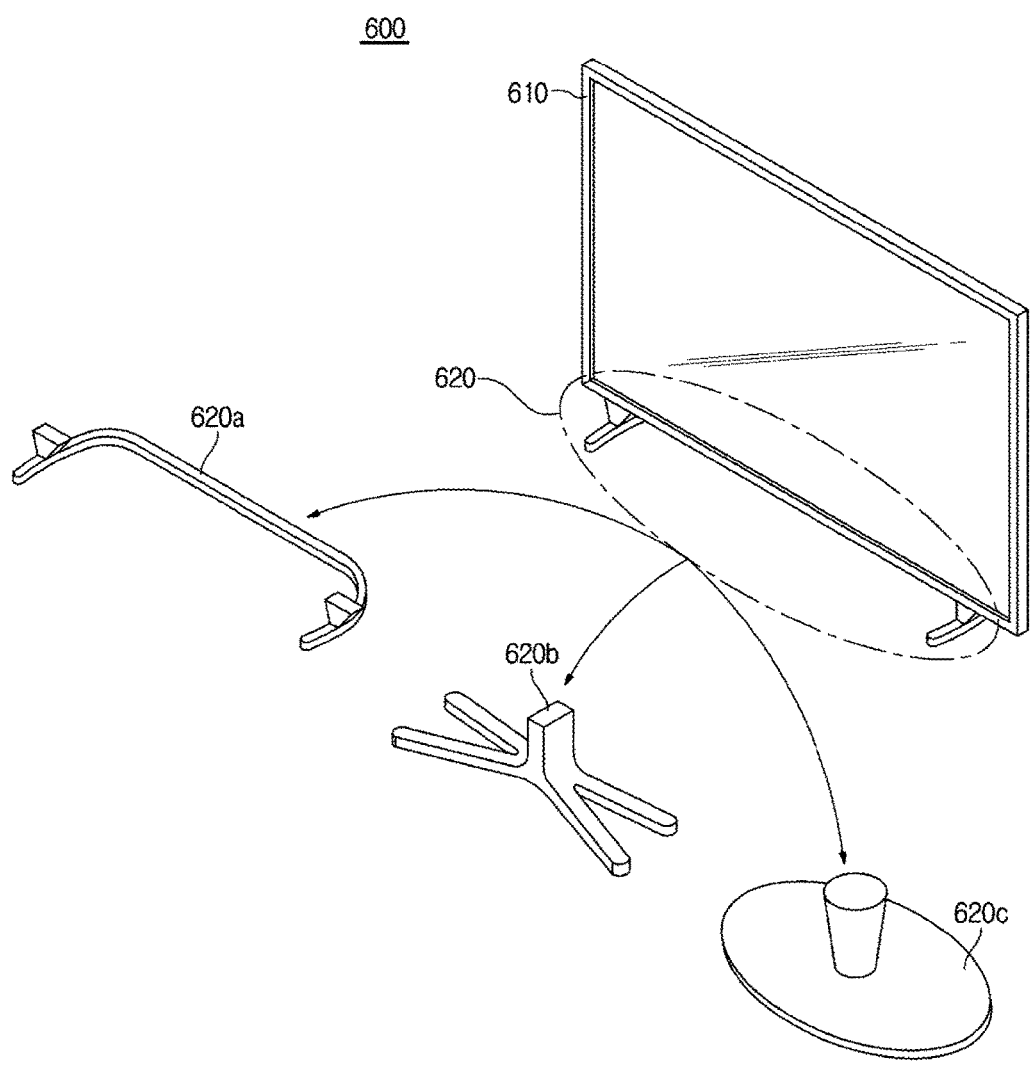

METHOD OF MANUFACTURING MULTI-LAYER THIN FILM, MEMBER INCLUDING THE SAME AND ELECTRONIC PRODUCT INCLUDING THE SAME

CROSS-REFERENCE TO RELATED APPLICATIONS

This application claims priority from Korean Patent Application Nos. 2013-0062484, 2013-0078132 and 2013-0131649 filed, respectively, on May 31, 2013, Jul. 4, 2013 and Oct. 31, 2013 in the Korean Intellectual Property Office, the disclosures of which are incorporated herein by reference.

BACKGROUND

1. Field

Apparatuses and methods consistent with exemplary embodiments relate to a method of depositing target particles, detached from a target by plasma discharge of inert gas, on a metal object.

2. Description of the Related Art

Metal materials are utilized in a variety of applications including interior and exterior materials for electronic products and vehicles. Metal materials are often used as exterior materials due to the beautiful appearance and luxuriousness thereof. In general, processed metal materials are used after post-treatment such as coating, plating or anodizing because without such post-treatment they may be unsuitable for use, with respect to their outer appearance, due to the surface roughness formed during mechanical processing.

Coating includes a variety of types and methods classified depending on the type of paints used. Typical synthetic resin paints have the advantages of improving the evenness of metal materials and rendering various colors, but have a the disadvantage of decreasing metallic texture.

Electroplating is a generally-used plating method. Plating with noble metals such as gold or silver or chromium, having superior corrosion resistance may be generally used as plating for ornamental purposes. Chromium plating has a high strength and is highly resistant to corrosion, and is thus used for the outer surfaces of vehicles and electronic products and has the advantages of considerably reducing the roughness of metal materials due to having a thickness of several tens of micrometers, and of having superior scratch resistance, but has the disadvantages of having a high risk of defect generation and environmental pollution.

Anodizing is a post-treatment method of forming an oxide thin film according to base materials and has the advantages of improving the hardness and corrosion resistance of the base materials and rendering a variety of colors according to dyes, but has the disadvantages of limited base materials, deteriorated gloss of anodized surfaces and an inferior appearance, as compared to plating.

SUMMARY

One or more exemplary embodiments may provide a method of manufacturing a multi-layer thin film including coating a coating layer on a surface of a metal material to reduce surface roughness of the metal material and sequentially depositing a hardness-enhancing layer, a color layer and a protective layer on the coating layer.

One or more exemplary embodiments may provide a metal member including a coating layer, a hardness-enhancing layer, a color layer and a protective layer deposited in this order on a metal object.

One or more exemplary embodiments may provide an electronic product having an outer appearance formed by a housing containing a metal component and including a multi-layer thin film having a hardness-enhancing layer, a color layer and a protective layer formed on the entirety or part of a surface thereof.

Additional exemplary aspects will be set forth in part in the description which follows and, in part, will be obvious from the description, or may be learned by practice of the exemplary embodiments.

According to an aspect of an exemplary embodiment, a method of manufacturing a multi-layer thin film includes coating a metal object with a coating layer, depositing at least one hardness-enhancing layer on the coating layer, and depositing a color layer on the hardness-enhancing layer.

The coating of the metal object with the coating layer may include forming a substantially smooth surface of the coating layer.

The coating of the metal object with the coating layer may include forming the coating layer to a thickness of about 1 to about 30 micrometers.

The coating of the metal object with the coating layer may be carried out using a stoving paint, a UV paint or a powdered paint.

In the coating of the metal object with the coating layer, the coating layer may include at least one of an acrylic resin, a melamine resin and an epoxy resin.

The deposition of the hardness-enhancing layer on the coating layer may include depositing a first hardness-enhancing layer including chromium (Cr) on the coating layer and depositing a second hardness-enhancing layer including at least one material selected from a group consisting of titanium nitride (TiN), chromium nitride (CrN) and aluminum nitride (AlN), on the first hardness-enhancing layer.

In the deposition of the color layer on the hardness-enhancing layer, the color layer may include at least one material selected from a group consisting of chromium (Cr), titanium (Ti), copper (Cu), gold (Au) and titanium nitride (TiN).

The method may further include depositing a protective layer, including at least one material selected from a group consisting of Teflon silicon, after the deposition of the color layer on the hardness-enhancing layer.

At least one of a pulsed DC power source and a radio frequency (RF) power source may be used as a power source.

According to an aspect of another exemplary embodiment, a metal member includes a metal object, a coating layer coated on the metal object to reduce surface roughness of the metal object, at least one hardness-enhancing layer deposited on the coating layer to reinforce hardness of the metal object and a color layer deposited on the hardness-enhancing layer to impart metallic appearance to the metal object.

The coating layer may be coated smoothly on the metal object so as to reduce surface roughness of the metal object.

The coating layer may be coated to a thickness of about 1 to about 30 micrometers.

The coating layer may include at least one material selected from a group consisting of a stoving paint, a UV paint and a powdered paint.

The coating layer may include at least one of an acrylic resin, a melamine resin and an epoxy resin.

The hardness-enhancing layer may include depositing a first hardness-enhancing layer, including chromium (Cr), on the coating layer and depositing a second hardness-enhancing layer, including at least one material selected from a group consisting of titanium nitride (TiN), chromium nitride (CrN) and aluminum nitride (AlN), on the first hardness-enhancing layer.

The color layer may include at least one material selected from a group consisting of chromium (Cr), titanium (Ti), copper (Cu), gold (Au) and titanium nitride (TiN).

The metal member may further include a protective layer deposited on the color layer and the protective layer may include at least one material selected from a group consisting of Teflon and silicon.

According to an aspect of another exemplary embodiment, an electronic product includes a housing including a metal component and a multi-layer thin film bonded to an entirety or a part of a surface of the housing, wherein the multi-layer thin film includes a coating layer bonded to the entirety or part of the surface of the housing, at least one hardness-enhancing layer bonded to the coating layer and a color layer bonded to the hardness-enhancing layer.

The housing may include an accessory of the housing.

The metal component may include at least one material selected from a group consisting of aluminum (Al), zinc (Zn), magnesium (Mg), steel use stainless (SUS), stainless steel (STS) and steel.

The hardness-enhancing layer may include a first hardness-enhancing layer, including chromium (Cr), deposited on the coating layer and a second hardness-enhancing layer, including at least one material selected from a group consisting of titanium nitride (TiN), chromium nitride (CrN) and aluminum nitride (AlN), deposited on the first hardness-enhancing layer.

The color layer may include at least one material selected from a group consisting of chromium (Cr), titanium (Ti), copper (Cu), gold (Au) and titanium nitride (TiN).

The electronic product may further include a protective layer bonded to the color layer and the protective layer may include at least one material selected from a group consisting of Teflon and silicon.

BRIEF DESCRIPTION OF THE DRAWINGS

These and/or other exemplary aspects and advantages will become apparent and more readily appreciated from the following description of exemplary embodiments, taken in conjunction with the accompanying drawings in which:

FIG. 6 illustrates a TV having an outer appearance formed by a housing including the multi-layer thin film shown in FIG. 5 bonded to a surface thereof, as an example of an electronic product according to an exemplary embodiment;

DETAILED DESCRIPTION

Figure 1A:
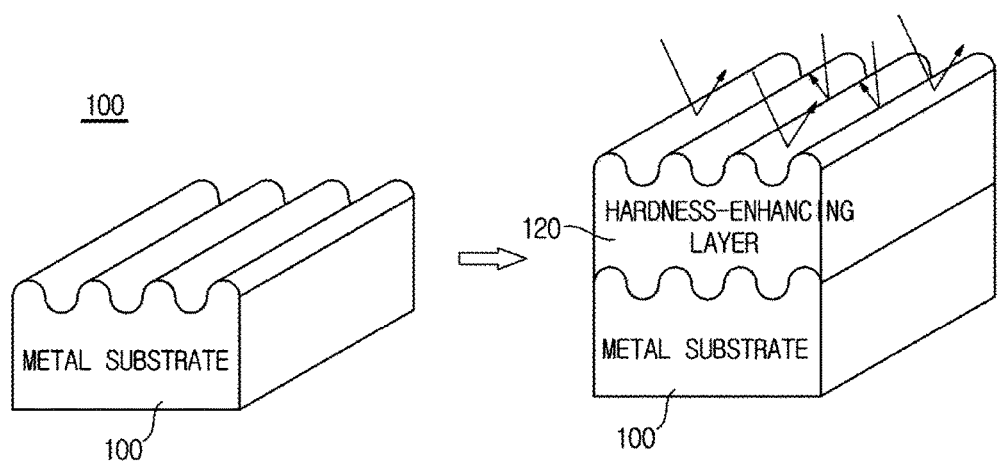
FIG. 1A shows a surface of a metal thin film deposited on a metal object without forming the coating layer thereon.

Reference will now be made in detail to exemplary embodiments which are illustrated in the accompanying drawings, wherein like reference numerals refer to like elements throughout.

Hereinafter, a method of manufacturing a multi-layer thin film using a multi-layer thin film deposition device will be described with reference to the annexed drawings.

A metal material has a predetermined surface roughness due to post-treatment after mechanical processing. Extrusion marks formed by extrusion have a roughness of about 1 to 2 micrometers, and materials after die-casting have roughness of several micrometers due to micro-cracks. Accordingly, in general, processed metal materials are unsuitable for use as exterior materials due to the roughness caused by mechanical processing, and thus, these materials require post-treatment for controlling surface roughness.

Hereinafter, a method of manufacturing a multi-layer thin film as an example of post-treatment for controlling surface roughness of metal materials will be described in detail.

A method of manufacturing a multi-layer thin film using a sputtering deposition apparatus as a method of manufacturing a multi-layer thin film according to an exemplary embodiment will be described in detail for convenience of description.

The method of manufacturing a multi-layer thin film according to the present embodiment includes coating a coating layer on a processed metal material (metal object) to reduce a surface roughness of the metal material, depositing at least one hardness-enhancing layer on the coating layer, and depositing a color layer on the hardness-enhancing layer.

The deposition of the at least one hardness-enhancing layer on the coating layer may include depositing a first hardness-enhancing layer containing chromium (Cr) on the coating layer and depositing a second hardness-enhancing layer, on the first hardness-enhancing layer, the second hardness-enhancing layer containing at least one material selected from a group consisting of titanium nitride (TiN), chromium nitride (CrN) and aluminum nitride (AlN).

In the deposition of the color layer on the hardness-enhancing layer, the color layer may contain at least one material selected from a group consisting of chromium (Cr), titanium (Ti), copper (Cu), gold (Au) and titanium nitride (TiN).

The method may further include depositing a protective layer on the color layer, the protective layer containing at least one of Teflon and silicon.

Figure 1B:
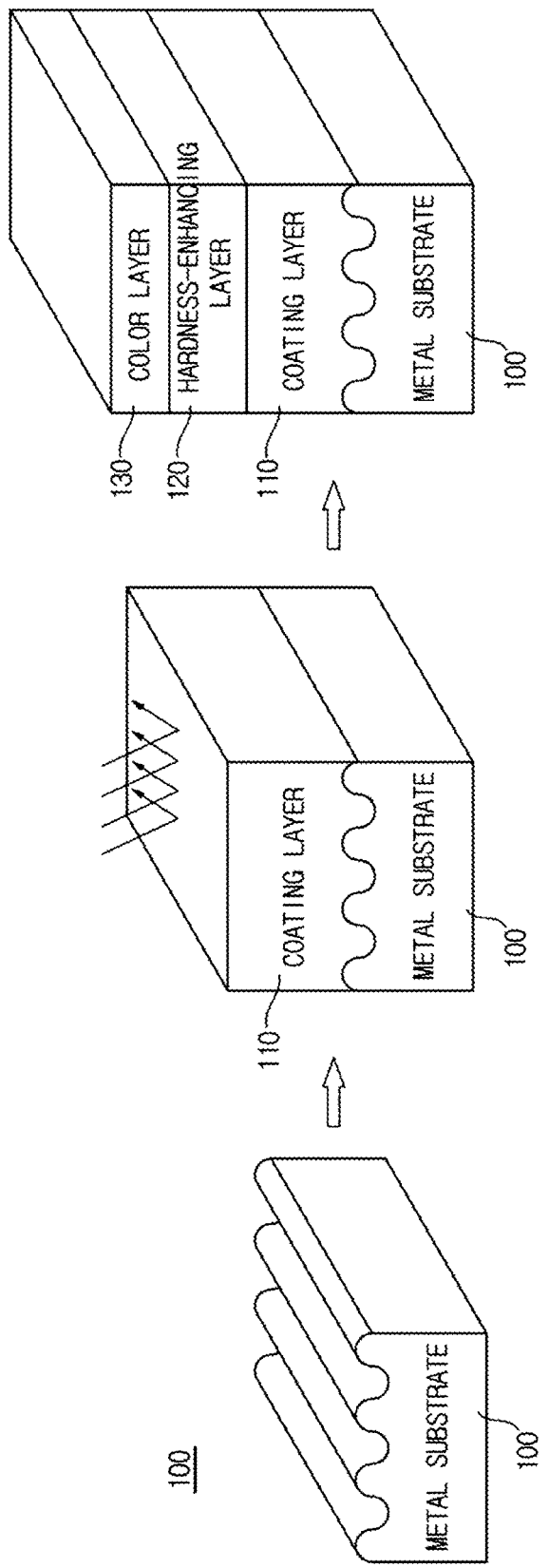
FIG. 1B shows a structure of a metal thin film deposited after a flat coating layer is coated on a metal object.

FIGS. 1A and 1B are views illustrating the reason for forming the coating layer on the processed metal material (metal object): to reduce surface roughness of the metal material. FIG. 1A shows a surface of a metal thin film deposited on the metal object 100 without forming the coating layer 110 thereon, and FIG. 1B shows a structure of a metal thin film deposited after a flat coating layer 110 is coated on the metal object 100.

Referring to FIG. 1A, processed metal generally has a surface roughness of several micrometers, and, without any additional process, the surface roughness of the metal deposited by sputtering will also be several micrometers. With this surface roughness, diffused reflection occurs, thus causing a deterioration in the gloss of the surface and inhibiting the acquisition of a beautiful metallic texture.

In order to solve these problems, as shown in FIG. 1B, a coating layer 110 is formed on a metal object 100 having a roughness of several micrometers, and a hardness-enhancing layer 120 and a color layer 130 are sequentially deposited thereon to constitute a multilayer thin film.

The coating layer 110 is coated flatly so that a substantially smooth surface is formed on the metal object 100 by the coating layer 110. The multi-layer thin film deposited on the coating layer is also deposited smoothly due to the smooth surface of the coating layer 110, and light incident upon the multilayer thin film is regularly reflected by the surface of the thin film, thus providing a beautiful metallic texture.

A thickness of the coating layer 110 may be controlled by controlling a viscosity of paint. That is, the thickness of the coating layer increases when the viscosity of the paint increases, and the thickness of the coating layer decreases when the viscosity of the paint decreases. The formation of the coating layer 110 on the metal object 100 includes forming the coating layer to a thickness of about 1 to 30 micrometers by controlling the viscosity of the paint.

An operation of forming the multi-layer thin film including the hardness-enhancing layer 120 and the color layer 130 will be described in detail.

Sputtering is a representative physical vapor deposition method wherein atoms are ejected from a solid sample via an energy generated during collision of ionization-accelerated inert gas with a solid sample in a vacuum chamber. Sputtering is used to form or deposit thin film metal layers and metal oxide layers required to manufacture semiconductors and display devices and the like.

The inert gas ionized in the vacuum chamber according to the present embodiment may be argon (Ar) gas and may be used in combination with one or more other inert gases.

Figure 2:
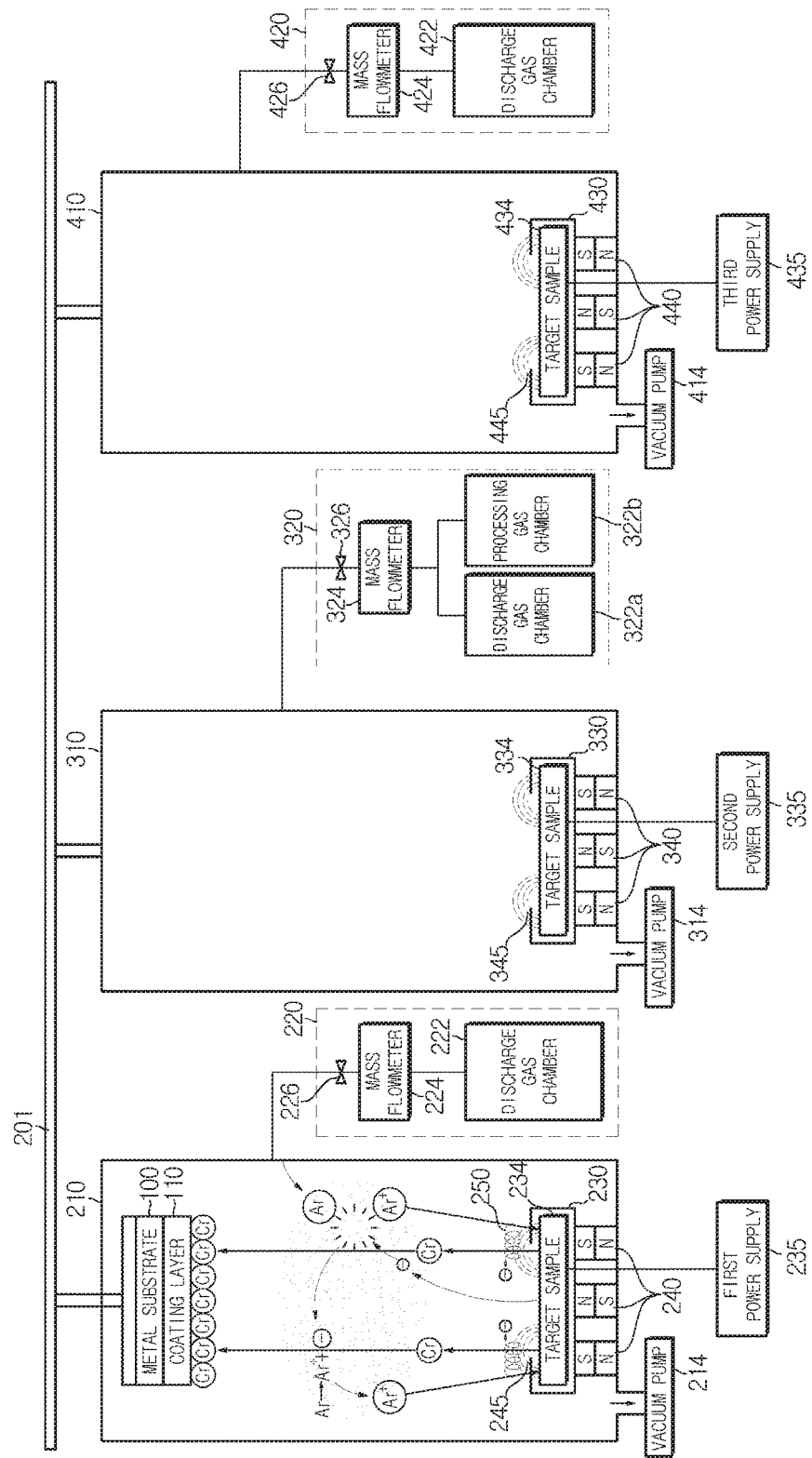
FIG. 2 is a view illustrating a sputtering deposition apparatus to form a multi-layer thin film using a sputtering method according to an exemplary embodiment.

FIG. 2 is a view illustrating a sputtering deposition apparatus 200 used to describe an operation of manufacturing a multi-layer thin film using a sputtering method.

Referring to FIG. 2, the sputtering deposition apparatus 200 to implement the manufacturing method according to the present embodiment includes a plurality of vacuum chambers 210, 310 and 410 in which sputtering is performed, a plurality of vacuum pumps 214, 314 and 414, a plurality of gas supply systems 220, 320 and 420, a rail 201, a plurality of guns 230, 330 and 430, and a plurality of target samples 234, 334 and 434. The sputtering deposition apparatus 200 may further include a plurality of magnetrons 240, 340 and 440.

The vacuum pumps 214, 314 and 414 may be provided respectively at sides of the vacuum chambers 210, 310 and 410, and may maintain the vacuum states of the vacuum chambers 210, 310 and 410.

The gas supply systems 220, 320 and 420 may be provided respectively at sidewalls of the vacuum chambers 210, 310 and 410, and may supply gas to the vacuum chambers 210, 310 and 410.

Each of the gas supply systems 220, 320 and 420 may include a discharge gas chamber 222, 322a and 422 to store argon (Ar) gas to be ionized, mass flowmeters 224, 324 and 424 to connect the vacuum chambers 210, 310 and 410 to the discharge gas chambers 222, 322a and 422, and control valves 226, 326 and 426 to control the flow of gas from the gas chambers 222, 322a and 422 to the vacuum chambers 210, 310 and 410. In addition, the gas supply system 320 of the second chamber 310 may further include a processing gas chamber 322b to store nitrogen ($N_2$) gas.

The rail 201 is provided at an upper surface of the vacuum chambers 210, 310 and 410, and an object on which the thin films are to be deposited is mounted on the rail 201. The object may be a planar metal object 100 or may be a component including a curved surface or a projection of a part of a surface thereof. The use of the sputtering deposition device of FIG. 2 for deposition on the metal object 100 has been described for convenience of description.

Target samples 234, 334 and 434 are provided in inner parts of the vacuum chambers 210, 310 and 410 and are disposed opposite to the object. The object may have a planar or curved shape. The target samples 234, 334 and 434 may be used according to the shape of the object to be deposited.

The guns 230, 330 and 430 are provided within the vacuum chambers 210, 310 and 410 and are connected to a cathode through the power supplies 235, 335 and 435. When the power supplies 235, 335 and 435 supply power to the guns 230, 330 and 430, a negative electric field is generated and argon (Ar) gas begins discharging and collides with electrons supplied from the power supply to produce argon ions ($Ar^+$) and generate plasma.

The magnetrons 240, 340 and 440 are provided, respectively, within the vacuum chambers 210, 310 and 410 and are mounted in plural under the target samples 234, 334 and 434.

Magnetic fields 245, 345 and 445 are generated by the magnetrons 240, 340 and 440. Electrons isolated from argon (Ar) move along helical paths 250 when they receive the force of the generated magnetic field as well as the force of magnetic field formed by the magnetrons 240, 340 and 440.

The electrons moving along helical paths 250 are captured by the magnetic field and do not readily escaped therefrom, and the density of electrons in plasma thus increases.

For this reason, a level of argon (Ar) atoms ionized in the vacuum chambers 210, 310 and 410 increases, the number of argon (Ar) atoms which collide with the target samples 234, 334 and 434 also increases, and an efficiency of thin film deposition thus improves.

Figure 3A:
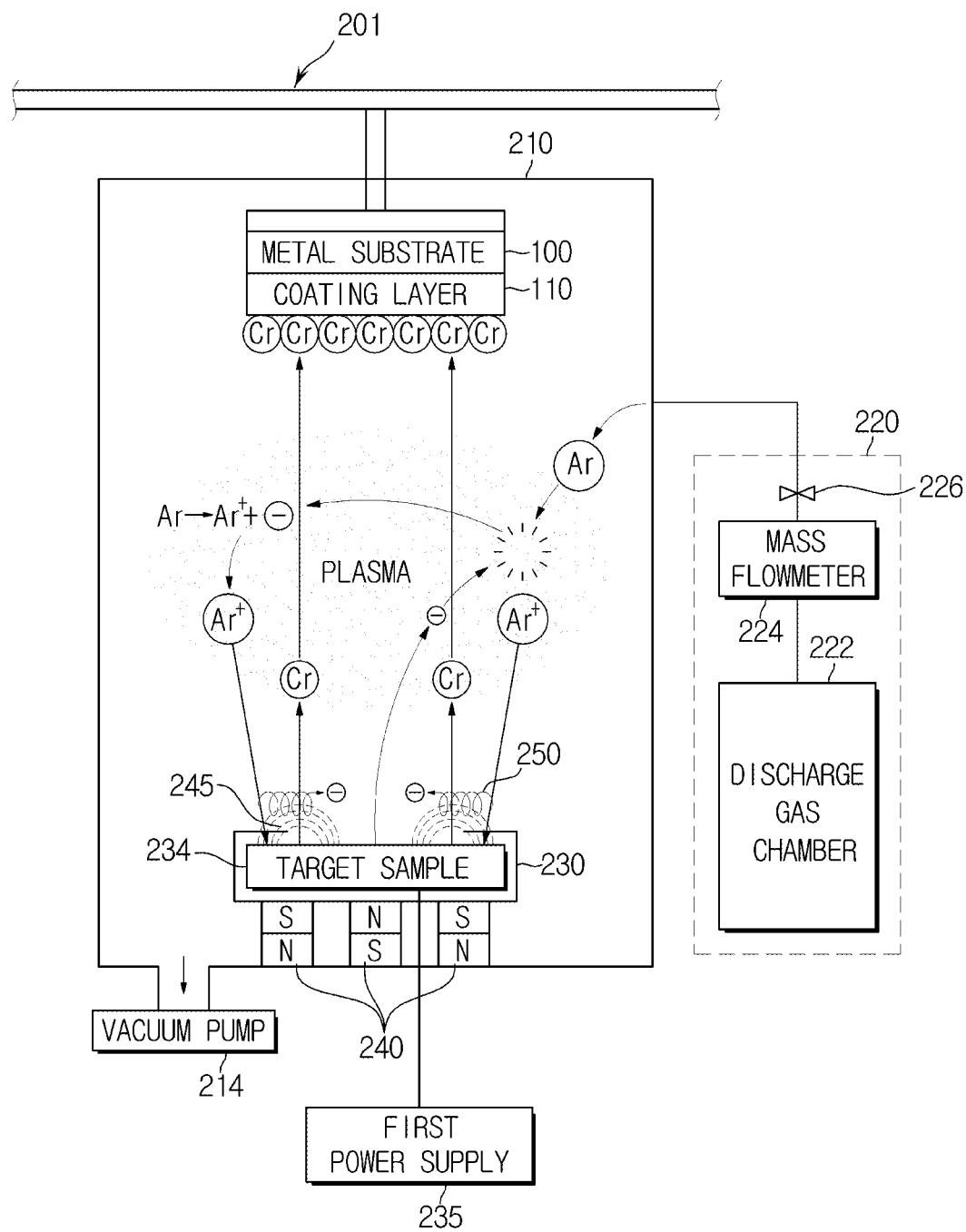
FIGS. 3A, 3B and 3C illustrate an exemplary method of manufacturing a multi-layer thin film using the sputtering deposition apparatus shown in FIG. 2.
Figure 3B:
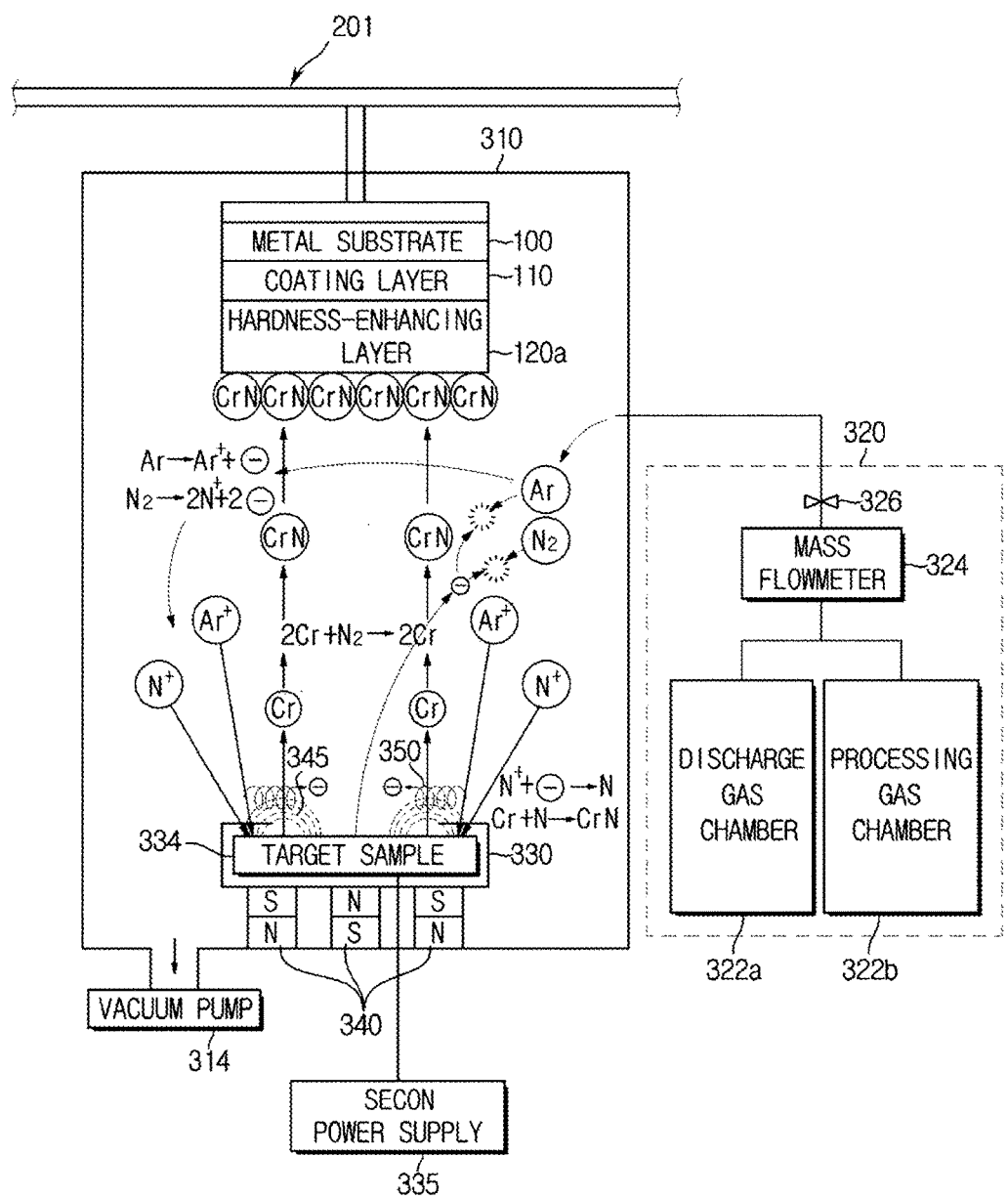
Figure 3C:
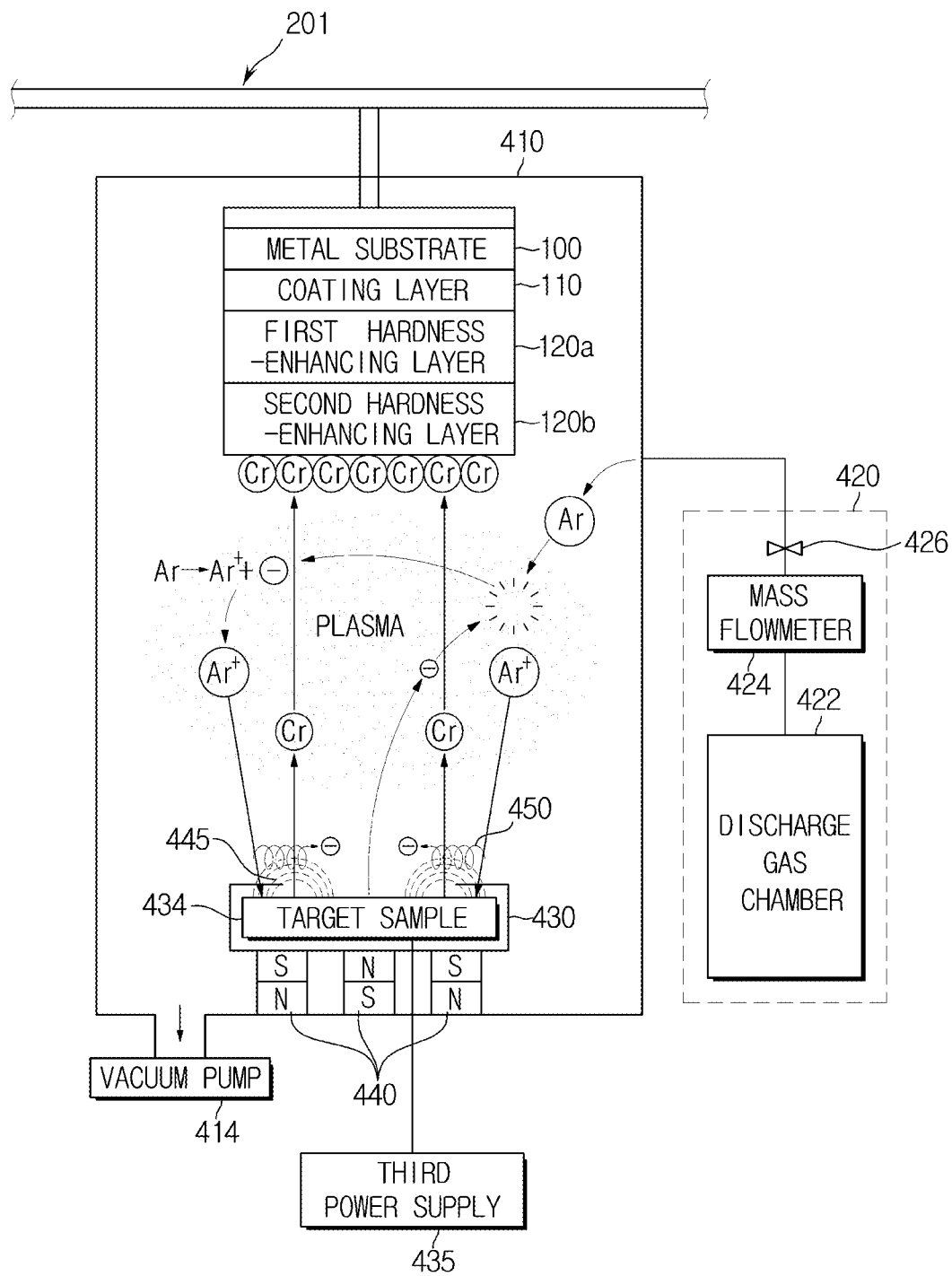

FIGS. 3A, 3B and 3C illustrate a method of manufacturing a multi-layer thin film according to an exemplary embodiment using the sputtering deposition apparatus having a configuration shown in FIG. 2.

The method of manufacturing a multi-layer thin film according to the present embodiment includes coating a coating layer 110 on a surface of a metal object 100, depositing a hardness-enhancing layer 120 on the coating layer 110, and depositing a color layer 130 containing at least one material selected from a group consisting of chromium (Cr), titanium (Ti), copper (Cu), gold (Au) and titanium nitride (TiN), on the hardness-enhancing layer 120.

The deposition of the hardness-enhancing layer 120 may include depositing a first hardness-enhancing layer 120a containing chromium (Cr) on the coating layer 110 and depositing a second hardness-enhancing layer 120b containing at least one material selected from a group consisting of chromium nitride (CrN), titanium nitride (TiN) and aluminum nitride (AlN), on the first hardness-enhancing layer 120a, as described above.

Hereinafter, an exemplary method of manufacturing a multi-layer thin film including depositing a first hardness-enhancing layer 120a containing chromium (Cr), a second hardness-enhancing layer 120b containing chromium nitride (CrN) and a color layer 130 containing chromium (Cr) will be described.

During deposition, temperatures of the target samples 234, 334 and 434 are maintained in a range from room temperature to about 200° C. or less and a temperature of the object moving along the rail 201 is maintained at about 60° C. to 70° C.

The method of manufacturing the multi-layer thin film will be described below with reference to FIGS. 3A, 3B and 3C.

So as to form the first hardness-enhancing layer 120a on the coating layer 110-coated metal object 100, as shown in FIG. 3A, the metal object 100 coated with the coating layer 110 is mounted in the first vacuum chamber 210, chromium (Cr) is placed on the target sample 334 disposed thereunder, and argon (Ar) gas is supplied to the first vacuum chamber 210 while maintaining an inner atmosphere of the first vacuum chamber 210 under vacuum by a vacuum pump 212 and controlling a mass flowmeter 224.

When power is supplied to a gun 230 through a power supply 235, because the gun 230 is connected to a cathode of the power supply 235 to generate a negative magnetic field, discharge begins to produce plasma.

More specifically, the argon (Ar) gas supplied to the first vacuum chamber 210 collides with primary and tertiary electrons and is then ionized and cleaved into a cation ($Ar^+$) and an electron, as depicted by the following Reaction Scheme 1, to produce plasma.

$$Ar \to Ar^+ + e^-$$ Reaction Scheme 1:

As the discharge gas for modification, argon (Ar) gas may be used alone or in combination with another inert gas. The following description is given on the assumption that argon (Ar) gas is used as the discharge gas.

When plasma is generated, a positively-charged argon ion ($Ar^+$) is accelerated and drawn toward the target sample 234 serving as a cathode upon application of a magnetic field thereto, the accelerated argon ion ($Ar^+$) collides with the target sample 234 to transfer energy to the surface of the target sample 234 and chromium atoms are ejected from the target sample 234 due to the energy.

The ejected chromium atoms are bonded to the metal object 100 coated with the coating layer 110, disposed on the first vacuum chamber 210 due to collision energy of argon ion ($Ar^+$) to form the first hardness-enhancing layer 120a.

The first hardness-enhancing layer 120a may be formed to a thickness of about 1 to 500 nanometers.

A direct current (DC) power source, a pulsed DC power source or a radio frequency (RF) power source may be used as the first power supply 235.

Of these, the DC power source provides a low density of deposited layers, and the RF power source provides a low deposition rate of chromium atoms (Cr). Accordingly, a pulsed DC power source may be used.

The pulsed DC power source may supply a voltage greater than about 0V and not greater than about 200V.

After formation of the first hardness-enhancing layer 120a, the second hardness-enhancing layer 120b is deposited on the first hardness-enhancing layer 120a. So as to deposit the second hardness-enhancing layer 120b on the first hardness-enhancing layer 120a, as shown in FIG. 3A, the metal object 100 is moved to and mounted in the second vacuum chamber 310. After the metal object 100 provided with the coating layer 110 and the first hardness-enhancing layer 120a is mounted in the second vacuum chamber 310, argon (Ar) gas and nitrogen ($N_2$) gas are supplied to the second vacuum chamber 310 while maintaining an inner atmosphere of the second vacuum chamber 310 under vacuum by a vacuum pump 312 and controlling a mass flowmeter 324.

Then, discharge begins when the second power supply 335 supplies power to the gun 330 and reactions occur to produce plasma ionized from argon (Ar) gas and nitrogen ($N_2$) gas, as depicted by Reaction Scheme 1 above and Reaction Scheme 2 described below.

$$N_2 \to 2N^+$$ Reaction Scheme 2:

All nitrogen ($N_2$) molecules are not ionized. That is, some nitrogen molecules are present in a molecular state and the other nitrogen molecules are ionized.

The argon ions ($Ar^+$) and nitrogen ions ($N^+$) are accelerated and drawn toward the target sample serving as a cathode upon application of a magnetic field thereto, the accelerated argon ions ($Ar^+$) collide with the target sample to transfer energy to the surface of the target sample and chromium (Cr) atoms are ejected from the target sample.

The chromium (Cr) atoms having high energy react with nitrogen ($N_2$) injected into the second vacuum chamber 310 to produce chromium nitride (CrN) as depicted by the following Reaction Scheme 3 and chromium nitride (CrN) is deposited on the surface of the first hardness-enhancing layer 120a to form the second hardness-enhancing layer 120b.

$$2Cr + N_2 \to 2CrN$$ Reaction Scheme 3:

As depicted by the following Reaction Scheme 4, the nitrogen ions ($N^+$), which are accelerated and drawn toward the target sample and are then partially ionized, each receive an electron while colliding with the target sample and are then neutralized (as shown in Reaction Scheme 4(1)) and some may react with chromium (Cr) (as shown in Reaction Scheme 4 (2)).

Reaction Scheme 4:

$$N^+ + e^- \to N \quad (1)$$

$$N + Cr \to CrN \quad (2)$$

In this reaction scheme, some of chromium nitride (CrN) produced by the reaction remains on the surface of the chromium target sample 334, thus causing color change of the target sample 334.

The second hardness-enhancing layer 120b may be formed to a thickness of about 1 to 500 nanometers.

A DC power source, a pulsed DC power source or a radio frequency (RF) power source may be used as the second power supply 335.

Of these, the DC power source creates a low density of deposited layers, and the RF power source causes a low rate of formation of the second hardness-enhancing layer 120b by depositing chromium nitrogen (CrN) on the surface of the first hardness-enhancing layer 120a. Accordingly, a pulsed DC power source may be used.

The pulsed DC power source may supply a voltage greater than about 0V and not greater than about 200V.

After formation of the second hardness-enhancing layer 120b, so as to form the color layer on the second hardness-enhancing layer 120b, the metal object 100 is moved along the rail 201 and is mounted in the third vacuum chamber 410, as shown in FIG. 3C. After mounting of the metal object 100, provided with the coating layer 110, the first hardness-enhancing layer 120a and the hardness-enhancing layer 120b, in the third vacuum chamber 410, argon (Ar) gas is supplied to the third vacuum chamber 410 while maintaining an atmosphere of the third vacuum chamber 410 under vacuum by the vacuum pump 414 and controlling a mass flowmeter.

Then, plasma is produced in the same manner as in the first vacuum chamber 210, and chromium (Cr) atoms ejected from the target sample 434 are deposited on the second hardness-enhancing layer 120b to form the color layer 130.

The color layer 130 may be formed to a thickness of about 1 to 500 nanometers. Hereinafter, repeated description is omitted.

A DC power source, a pulsed DC power source or a radio frequency (RF) power source may be used as the third power supply 435. Of these, the DC power source creates a low density of deposited layers, and the RF power source creates a low deposition rate of chromium (Cr). Accordingly, a pulsed DC power source may be used.

The pulsed DC power source may supply a voltage greater than about 0V and not greater than about 200V.

The method may further include depositing a protective layer 140 containing at least one of Teflon and silicon on the color layer 130 after formation of the color layer 130 on the second hardness-enhancing layer 120b.

So as to further deposit the protective layer 140 containing at least one of Teflon and silicon on the color layer 130, the metal object 100 is moved to and is mounted in a fourth vacuum chamber. After mounting the metal object 100, provided with the coating layer 110, the first hardness-enhancing layer 120a and the hardness-enhancing layer 120b in the fourth vacuum chamber, argon (Ar) gas is supplied to the fourth vacuum chamber while maintaining an atmosphere of the fourth vacuum chamber under vacuum by the vacuum pump and controlling a mass flowmeter.

Then, plasma is produced in the same manner as in the first vacuum chamber 210, atoms ejected from the target sample 434 are deposited on the color layer 130 to form the protective layer 140 containing at least one of Teflon and silicon.

The protective layer 140 may be formed to a thickness of about 1 to 500 nanometers, or a thickness of about 30 to 300 nanometers.

The Teflon or silicon layer 130 has anti-fingerprinting property due to a contact angle with water, thus preventing fingerprints from being left on the metal thin film layer. In addition, the Teflon or silicon layer 130 protects the metal thin film from scratches due to as high hardness thereof.

Figure 4:
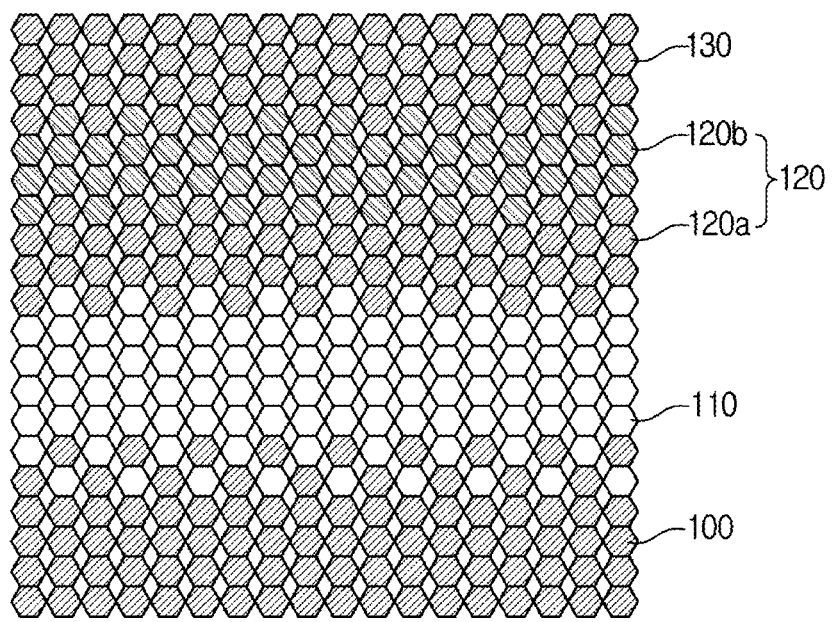
FIG. 4 is a view illustrating a structure of a metal member including a first hardness-enhancing layer, a second hardness-enhancing layer and a color layer deposited on a metal object according to an exemplary embodiment.

Hereinafter, a metal member according to an exemplary embodiment will be described in detail with reference to the annexed drawings. FIG. 4 is a view illustrating a structure of the metal member according to the present embodiment.

As shown in FIG. 4, the metal member according to the present embodiment includes a coating layer 110 formed on a surface of a metal object 100 to reduce surface roughness of the metal object 100, a hardness-enhancing layer 120 deposited on the coating layer 110 to enhance a hardness of the metal object 100 and a color layer 130 deposited on the hardness-enhancing layer 120 to provide a metallic appearance.

The coating layer 110 is coated smoothly such that surface roughness of the metal is controlled. That is, by forming the coating layer 110 to a thickness of several tens of micrometers, the surface roughness of several micrometers is reduced to obtain a flat surface.

The coating layer 110 includes a coating layer formed to a thickness of about 1 to 30 micrometers and contains at least one selected from the group consisting of stoving paint, UV paint and powdered paint. In addition, the coating layer 110 may contain at least one of an acrylic resin, a melamine resin and an epoxy resin.

The hardness-enhancing layer 120 may include a first hardness-enhancing layer 120a containing chromium (Cr) and a second hardness-enhancing layer 120b containing at least one material selected from a group consisting of titanium nitride (TiN), chromium nitride (CrN) and aluminum nitride (AlN). In addition, the second hardness-enhancing layer 120b may have a thickness of about 1 to 500 nanometers.

The color layer 130 may contain at least one material selected from a group consisting of chromium (Cr), titanium (Ti), copper (Cu), gold (Au) and titanium nitride (TiN) to impart metallic texture to an outer appearance of the metal member. In addition, the color layer 130 may have a thickness of about 1 to 500 nanometers in order to effectively provide a metallic texture.

Regarding a combination of the first hardness-enhancing layer 120a, the second hardness-enhancing layer 120b and the color layer 130 containing these substances, the first hardness-enhancing layer 120a may contain at least one type of component, the second hardness-enhancing layer 120b may contain at least three types of components and the color layer 130 may contain at least five types of components.

In conclusion, at least fifteen types of combinations are obtained because the first hardness-enhancing layer 120a may contain at least one type of component, the second hardness-enhancing layer 120b may contain at least three types of components and the color layer 130 may contain at least five types of components.

Meanwhile, the combinations may include combinations in which identical components are continuously deposited, as like in the case in which the second hardness-enhancing layer 120b contains titanium nitride (TiN) and the color layer 130 contains titanium nitride (TiN). However, it may be difficult to accomplish desired effects such as hardness enhancement with the combinations in which identical components are continuously deposited. Accordingly, continuous layers may include different components.

Hereinafter, a structure in which the first hardness-enhancing layer 120a containing chromium (Cr), the second hardness-enhancing layer 120b containing chromium nitride (CrN) and the color layer 130 containing chromium (Cr) are formed on the metal object 100 in this order will be described in detail.

Chromium (Cr) atoms are deposited on the coating layer 110 to form the first hardness-enhancing layer 120a. The chromium (Cr) atoms may be deposited by a sputtering method. In accordance with the sputtering method, chromium (Cr) atoms collide with a substrate at a relatively high momentum as compared to other PVD methods, thus providing strong bonding force between the chromium (Cr) atoms and the substrate. Referring to FIG. 4, the chromium (Cr) atoms are deeply embedded in the surface of the coating layer.

For this reason, the chromium (Cr) layer is bonded to the coating layer with a strong bonding energy and the strong bond energy improves the surface hardness of the metal object 100 and thus enhances anti-scratch properties. Current density in plasma and temperature may be controlled so that the chromium (Cr) atoms are effectively embedded in the coating layer.

After formation of the first hardness-enhancing layer 120*a* on the coating layer 110, the second hardness-enhancing layer 120*b* containing chromium nitride (CrN) is formed on the first hardness-enhancing layer 120*a*, and the color layer 130 containing chromium (Cr) is formed on the second hardness-enhancing layer 120*b* to obtain a multilayer thin film including the first hardness-enhancing layer 120*a*, the second hardness-enhancing layer 120*b*, and the color layer 130.

A single chromium (Cr) layer may be disadvantageous in that defective portions become weak and are continuously exposed in spite of any increased deposition thickness because of the uniform bonding structure. However, a metal member including the multilayer thin film according to one or more exemplary embodiments described herein has a structure in which the chromium nitride (CrN) layer is interposed between the chromium (Cr) layers, thus reducing defects generated in one portion due to difference in interlayer bonding structure and improving corrosion resistance.

Hereinafter, a structure of a metal member including a multilayer thin film according to an exemplary embodiment will be described in detail.

Figure 5:
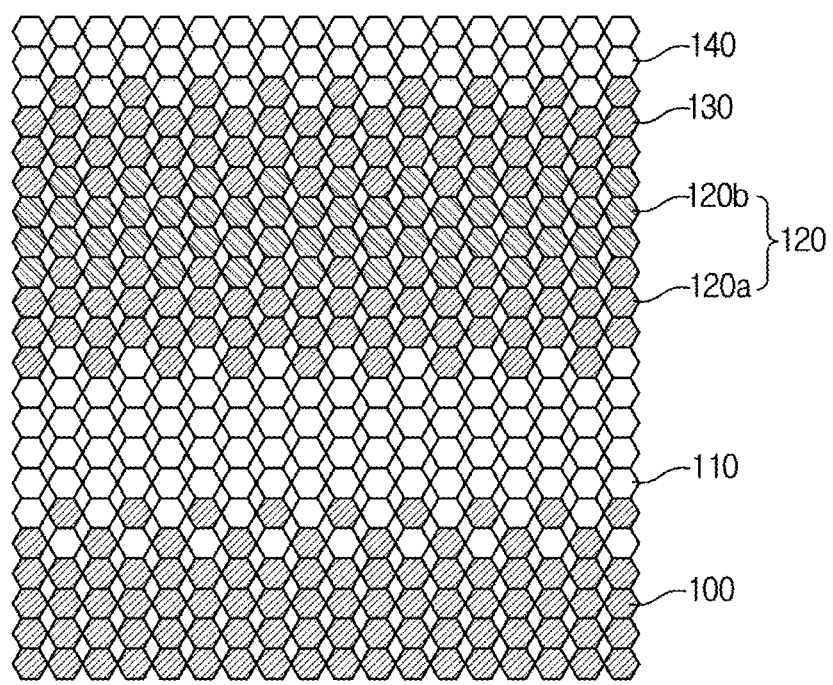
FIG. 5 illustrates a structure of a metal member further including a protective layer according to an exemplary embodiment.

FIG. 5 illustrates a structure of a metal member including a multi-layer thin film according to the present embodiment. Referring to FIG. 5, the metal member including the multi-layer thin film may further include a protective layer 140 containing Teflon or silicon, in addition to the structure shown in FIG. 4.

The protective layer 140 containing at least one of Teflon and silicon has anti-fingerprinting property due to a contact angle to water, thus preventing fingerprints from being left on the metal thin film layer. In addition, the protective layer 140 protects the metal thin film from scratches due to a high hardness thereof.

The protective layer 140, to protect the metal thin film, may be formed to a thickness of about 1 to 500 nanometers, or to a thickness of about 30 to 300 nanometers.

Hereinafter, an electronic product according to an exemplary embodiment will be described in detail.

The electronic product according to the present embodiment includes a housing containing a metal component and a multi-layer thin film bonded to an entirety or a part of the surface of the housing, wherein the multi-layer thin film includes a coating layer bonded to an entirety or a part of the surface of the housing, at least one hardness-enhancing layer bonded to the coating layer and a color layer bonded to the hardness-enhancing layer.

The housing may be a box-shaped part surrounding a mechanical apparatuses such as a box-type portion accommodating therein components or a frame containing instruments and may include an accessory of housing. The accessory of the housing includes portions of housing which constitute an outer appearance of the housing, such as bezel portions of TVs, stands of TVs and bezel portions of telecommunication equipment, or components of an electronic product.

In addition, the expression "housing contains a metal component" means that the housing contains a metal or an alloy thereof. More specifically, the housing may contain at least one material selected from a group consisting of aluminum (Al), zinc (Zn), magnesium (Mg), steel use stainless (SUS), stainless steel (STS) and steel.

The multilayer thin film includes a coating layer 110 formed on a surface of the housing to reduce surface roughness of the housing, a hardness-enhancing layer 120 deposited on the coating layer 110 to enhance surface hardness of the housing and a color layer 130 deposited on the hardness-enhancing layer 120 to impart a metallic appearance to the housing and may further include a protective layer 140 formed on the color layer 130 to protect the multilayer thin film.

FIG. 6 illustrates a TV 600 having an outer appearance formed by a housing having the multi-layer thin film shown in FIG. 5 bonded to a surface thereof, as an example of an electronic product according to an exemplary embodiment.

As shown in FIG. 6, the TV 600 may include a bezel portion 610 provided with the multi-layer thin film and stand portions 620*a*, 620*b* and 620*c* provided with the multi-layer thin film, and the housing provided with the multi-layer thin film provides improved hardness and a beautiful metal texture.

Figure 7A:
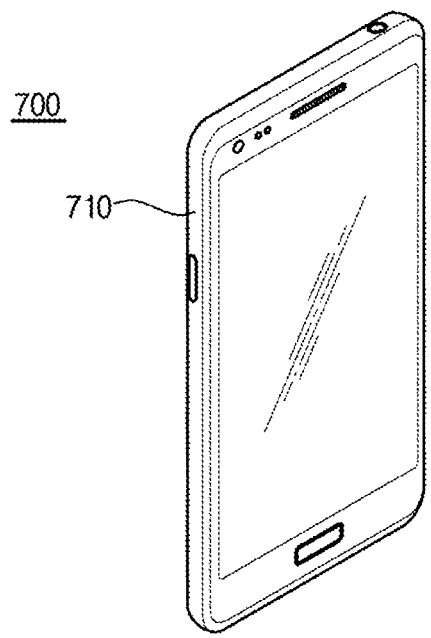
FIG. 7A is a perspective view illustrating a communication equipment having an outer appearance formed by a housing including the multi-layer thin film shown in FIG. 5 bonded to a surface thereof, as an example of an electronic product according to another exemplary embodiment.
Figure 7B:
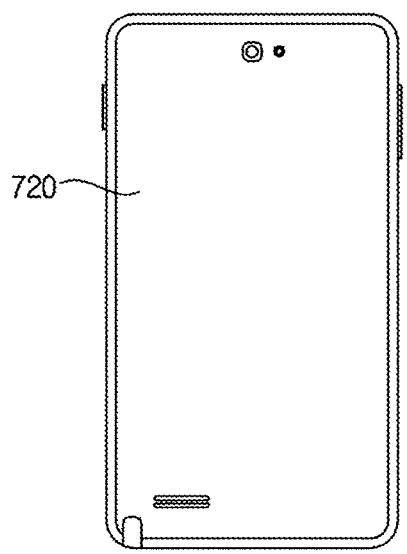
FIG. 7B is a rear surface of the communication equipment shown in FIG. 7A.

FIG. 7A is a perspective view illustrating a communication equipment 700 having an outer appearance formed by a housing having the multi-layer thin film shown in FIG. 5 bonded to a surface thereof, as an example of an electronic product according to another exemplary embodiment and FIG. 7B is a rear surface of the communication equipment 700.

As shown in FIGS. 7A and 7B, the housing to form the outer appearance of the communication equipment 700 may include the multi-layer thin film shown in FIG. 5, thus reinforcing hardness of the communication equipment 700 and imparting an outer appearance with a beautiful metal texture thereto.

As described above, the housing may include a bezel portion 710 of the communication equipment 700 and a case portion 720 of the communication equipment 700.

Figure 8:
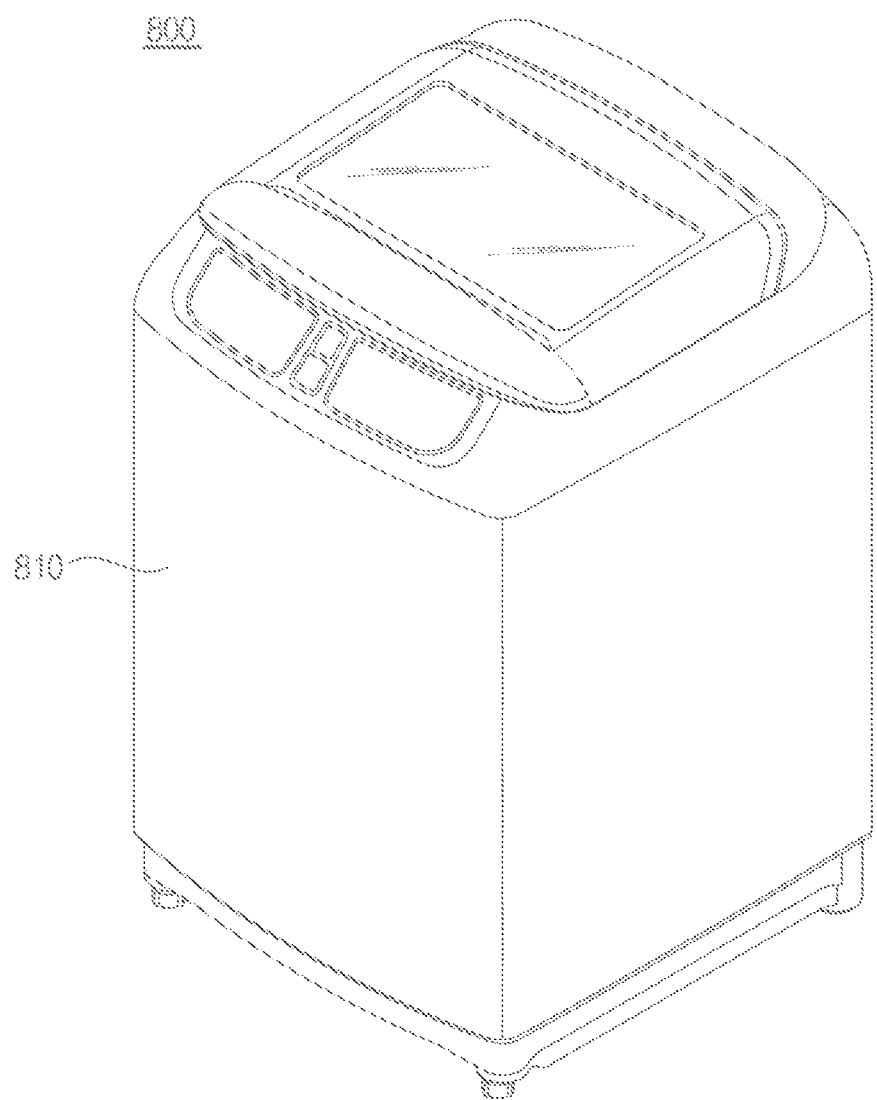
FIG. 8 is a perspective view illustrating a washing machine having an outer appearance formed by a housing including the multi-layer thin film shown in FIG. 5 bonded to a surface thereof, as an example of an electronic product according to another exemplary embodiment.

FIG. 8 is a perspective view illustrating a washing machine 800 having an outer appearance formed by a housing 810 having the multi-layer thin film shown in FIG. 5 bonded to a surface thereof, as an example of an electronic product according to another exemplary embodiment.

As shown in FIG. 8, the housing 810 to form the outer appearance of the washing machine 800 may include the multi-layer thin film shown in FIG. 5, thus reinforcing hardness of the washing machine 800 and imparting an outer appearance with a beautiful metal texture thereto.

Figure 9:
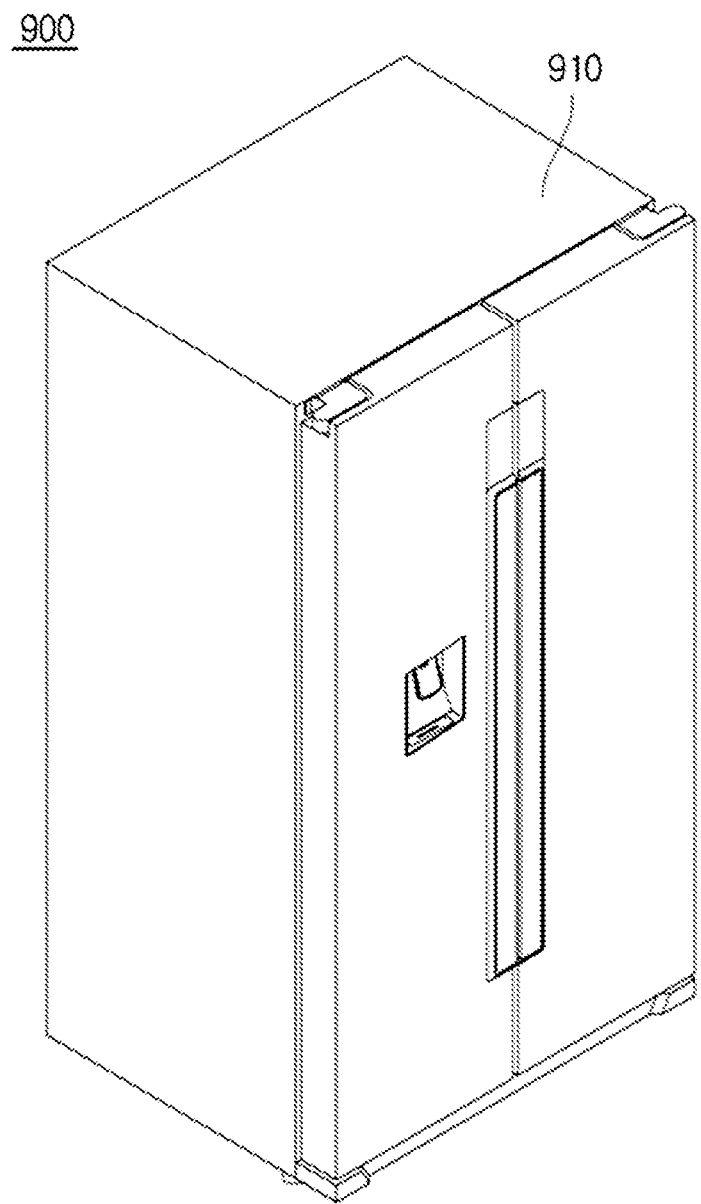
FIG. 9 is a perspective view illustrating a refrigerator having an outer appearance formed by a housing including the multi-layer thin film shown in FIG. 5 bonded to a surface thereof, as an example of an electronic product according to another exemplary embodiment.

FIG. 9 is a perspective view illustrating a refrigerator 900 having an outer appearance formed by a housing 910 having the multi-layer thin film shown in FIG. 5 bonded to a surface thereof, as an example of an electronic product according to another exemplary embodiment.

The housing 910 to form the outer appearance of the refrigerator 900 shown in FIG. 9 may include the multi-layer thin film shown in FIG. 5, thus reinforcing hardness of the refrigerator 900 and imparting an outer appearance with a beautiful metal texture thereto.

As apparent from the foregoing, a multi-layer thin film is effectively deposited by forming a coating layer on a metal material so as to reduce surface roughness of the metal material and a beautiful metallic texture may be obtained by depositing a color layer after controlling the surface roughness.

Hardness of the metal material is reinforced by depositing at least one hardness-enhancing layer containing at least one of chromium nitride (CrN), titanium nitride (TiN), aluminum nitride (AlN) and chromium (Cr) on the metal material.

The multi-layer thin film is formed by a sputtering deposition method which is a dry deposition method and is thus eco-friendly.

Although a few exemplary embodiments have been shown and described, it would be appreciated by those skilled in the art that changes may be made in these embodiments without departing from the principles and spirit of the inventive concept, the scope of which is defined in the claims and their equivalents.

What is claimed is:

1. A method of manufacturing a multi-layer thin film, the method comprising:
   coating a metal object with a coating layer;
   depositing at least one hardness-enhancing layer on the coating layer;
   depositing a color layer on the at least one hardness-enhancing layer, and
   depositing a protective layer on the color layer;
   wherein the depositing the at least one hardness-enhancing layer on the coating layer consists of:
      depositing a first hardness-enhancing layer comprising chromium (Cr) on the coating layer; and
      depositing a second hardness-enhancing layer on the first hardness-enhancing layer, the second hardness-enhancing layer comprising at least one material selected from a group consisting of titanium nitride (TiN), chromium nitride (CrN) and aluminum nitride (AlN).

2. The method according to claim 1, wherein the coating the metal object with the coating layer comprises creating a substantially smooth surface with the coating layer.

3. The method according to claim 1, wherein the coating the metal object with the coating layer comprises forming the coating layer to a thickness of about 1 to about 30 micrometers.

4. The method according to claim 1, wherein the coating the metal object with the coating layer comprises using one of a stoving paint, a UV paint and a powdered paint.

5. The method according to claim 1, wherein the coating layer comprises at least one of an acrylic resin, a melamine resin and an epoxy resin.

6. The method according to claim 1, wherein the color layer comprises at least one material selected from a group consisting of chromium (Cr), titanium (Ti), copper (Cu), gold (Au) and titanium nitride (TiN).

7. The method according to claim 1, wherein the protective layer consists of at least one material selected from a group consisting of Teflon and silicon.

8. The method according to claim 1, wherein each of the coating the metal object with the coating layer, the depositing the at least one hardness-enhancing layer, and the depositing the color layer comprise using at least one of a pulsed direct current power source and a radio frequency power source.

9. A metal member comprising:
   a metal object;
   a coating layer coated on the metal object;
   at least one hardness-enhancing layer disposed on the coating layer;
   a color layer deposited on the at least one hardness-enhancing layer; and
   a protective layer disposed on the color layer;
   wherein the at least one hardness-enhancing layer consists of:
      a first hardness-enhancing layer comprising chromium (Cr) disposed on the coating layer; and
      a second hardness-enhancing layer, disposed on the first hardness-enhancing layer, the second hardness-enhancing layer comprising at least one material selected from a group consisting of titanium nitride (TiN), chromium nitride (CrN) and aluminum nitride (AlN).

10. The metal member according to claim 9, wherein the coating layer comprises a substantially surface which is smoother than a surface of the metal object on which the coating layer is coated.

11. The metal member according to claim 9, wherein the coating layer has a thickness of about 1 to about 30 micrometers.

12. The metal member according to claim 9, wherein the coating layer comprises at least one material selected from a group consisting of a stoving paint, a UV paint and a powdered paint.

13. The metal member according to claim 9, wherein the coating layer comprises at least one of an acrylic resin, a melamine resin and an epoxy resin.

14. The metal member according to claim 9, wherein the color layer comprises at least one material selected from a group consisting of chromium (Cr), titanium (Ti), copper (Cu), gold (Au) and titanium nitride (TiN), and wherein the color layer is different from the second hardness-enhancing layer.

15. The metal member according to claim 9, wherein the protective layer consists of at least one material selected from a group consisting of Teflon and silicon.

16. An electronic product comprising:
   a housing comprising a metal component; and
   a multi-layer thin film bonded to an entirety or a part of a surface of the housing,
   wherein the multi-layer thin film consists of:
      a coating layer bonded to the entirety or part of the surface of the housing;
      at least one hardness-enhancing layer bonded to the coating layer;
      a color layer bonded to the at least one hardness-enhancing layer; and
      a protective layer bonded to the color layer, and
   wherein the at least one hardness-enhancing layer consists of:
      a first hardness-enhancing layer, comprising chromium (Cr) disposed on the coating layer; and
      a second hardness-enhancing layer, disposed on the first hardness-enhancing layer, the second hardness-enhancing layer comprising at least one material selected from a group consisting of titanium nitride (TiN), chromium nitride (CrN) and aluminum nitride (AlN).

17. The electronic product according to claim 16, wherein the housing comprises an accessory.

18. The electronic product according to claim 16, wherein the metal component comprises at least one material selected from a group consisting of aluminum (Al), zinc (Zn), magnesium (Mg), steel use stainless (SUS), stainless steel (STS) and steel.

19. The electronic product according to claim 16, wherein the color layer comprises at least one material selected from a group consisting of chromium (Cr), titanium (Ti), copper (Cu), gold (Au) and titanium nitride (TiN), and wherein the color layer is different from the second hardness-enhancing layer.

20. The electronic product according to claim 16, wherein the protective layer consists of at least one material selected from a group consisting of Teflon and silicon.

\* \* \* \* \*